United States Patent [19]

Korch

[11] Patent Number: 4,561,015

[45] Date of Patent: Dec. 24, 1985

[54] ALL-SOLID-STATE TELEVISION CAMERA

[75] Inventor: Hans-Erdmann Korch, Stuttgart, Fed. Rep. of Germany

[73] Assignee: International Business Machines Corporation, Armonk, N.Y.

[21] Appl. No.: 476,291

[22] Filed: Mar. 17, 1983

[30] Foreign Application Priority Data

Mar. 31, 1982 [DE] Fed. Rep. of Germany ............... 82102718[U]

[51] Int. Cl.[4] .................. H04N 3/14; H04N 9/07
[52] U.S. Cl. ............................... 358/44; 358/55; 358/225
[58] Field of Search ............. 358/41, 44, 213, 209, 358/225, 55; 357/24, 30; 250/578; 350/96.11, 96.18, 96.2, 96.28

[56] References Cited

U.S. PATENT DOCUMENTS

| | | | |
|---|---|---|---|
| 4,323,925 | 4/1982 | Abell | 358/213 |
| 4,404,586 | 4/1984 | Tabei | 358/44 |
| 4,432,022 | 2/1984 | Tokumitsu | 358/213 |

*Primary Examiner*—Michael A. Masinick

*Attorney, Agent, or Firm*—Jackson E. Stanland

[57] ABSTRACT

An all-solid-state television camera is described consisting of an optical unit, an electronic unit, and a housing for them. The electronic unit is in the form of a substrate carrying a linear or two-dimensional array of a plurality of semiconductor image sensors in a matrix layout on a semiconductor wafer, which substrate comprises contact parts connected to the contact pads on the semiconductor wafer. The optical unit comprises, in the least complicated embodiment, a light funnel array placed onto the semiconductor wafer which array carries at least one lens array whose aspherical lenses serve as imaging optics and contribute via a respective associated light funnel to the exposure of the individual semiconductor image sensors with mutual light screening. A second light funnel array is provided on the object side of the lens array and has a sunshade function for the imaging optics. The optical unit furthermore includes color filters and a plate structure to control the intensity of the light incident on the imaging optics. The optics and electronic units are fixed in a sleeve which serves as a representative housing of the television camera.

18 Claims, 6 Drawing Figures

ALL-SOLID-STATE TELEVISION CAMERA

TECHNICAL FIELD

The invention relates to a solid state television camera with a plurality of imaging optics of a fixed focal length which each expose one semiconductor image sensor.

BACKGROUND ART

Solid-state television cameras are very complex in their manufacture since the semiconductor image sensors must not show any error, even in pixel size, i.e. in minuscule surface areas. For avoiding the use of defective semiconductor image sensors, such sensors have to be subjected to a more or less complex testing after their manufacture, which generally involves a low yield.

Furthermore, solid-state television cameras of the above described type are relatively voluminous, and additionally require mechanical adjustments during their operation, which means that they require additional space. To sum up, there exists no television camera yet of minimum dimensions whose production and operation are neither complicated nor complex, and which is also of compact design.

It is a primary object of the present invention to remedy these drawbacks. The invention as characterized in the claims achieves the object of providing a solid-state television camera of reliable operation with minimum dimensions which is produced with minimum manufacturing efforts and is fully adjustable electronically.

DISCLOSURE OF THE INVENTION

The invention uses semiconductor image sensors arranged on one single semiconductor wafer in a linear or two-dimensional array, each sensor having specific associated imaging optics over one respective light funnel, the imaging optics and light funnels being provided in the form of a light funnel array assembled in one optical unit. The light funnel array additionally performs the function of a sunshade to keep off lateral scattered light.

The advantages of the invention substantially consist in that owing to the great number of semiconductor image sensors on one semiconductor wafer, and to the statistical distribution of defective surface areas, the deficiency of individual pixels is less serious than before, since the probability that there are pixel defects in all semiconductor image sensors in respectively the same position can practically be excluded. This means that the final check in the production of semiconductor wafers for solid-state television cameras is correspondingly simplified, and the yield is much higher than before.

Another advantage is that a television camera is provided of minimum dimensions that is easy to handle and which, by means of a plug unit connected to the substrate contact parts, can be connected by cable with a control unit for the camera control, as well as to units for utilizing the video signals. Alternatively, the substrate contact parts can also be connected directly via plug units to a control unit and video signal user units. Such a video signal user unit can e.g. consist of a video system with a suitable memory, as e.g. video disk or video magnetic tape cassette.

The imaging optics can also be made simply in a multi-lens version to eliminate imaging errors, in that a plurality of lens arrays with their respective lenses can be inserted one over the other in the optical unit.

The semiconductor wafer applied in the electronic unit of the solid-state television camera on a substrate with the substrate contact parts comprises, together with the semiconductor image sensors, the necessary conductive patterns which on the one hand can be applied lying directly between the semiconductor sensors immediately on the semiconductor wafer, and on the other hand with corresponding interspersed insulation layers in specific metallization levels over the semiconductor wafer. Transparent conductive images can also appear over the semiconductor image sensors themselves. Additionally, conductive patterns in the form of buried zones can also be provided in the semiconductor wafer itself beneath the semiconductor image sensors. All these facts are known so that no further reference will be made thereto. For further details reference is made to, e.g., "IEEE Journal of Solid State Circuits", Aug. 1980, Vol. SC-15, No. 4, as a special edition on VLSI-technique. Devices for applying semiconductor wafers on substrates, having semiconductor contact pads joined with corresponding contact pads on the respective substrate, are described e.g. in the book "Microelectronics Interconnection and Packaging", Electronics Magazine Books, McGraw Hill Publications Corporation, New York, 1980, pp. 187 to 197. There, different types of substrate contact parts are shown for connecting a substrate, like the one of the present solid-state television camera, via plug units to video systems. For simplifying the manufacture of the electronic components, a multilayer ceramic carrier could advantageously be provided as a substrate, which carrier could also contain conductive patterns for video systems plug-connected to the substrate, and for their control.

Embodiments for semiconductor image sensors which will not be referred to in detail are, e.g., described in "IEEE Transactions on Electron Devices", February 1978, Vol. ED-25, No. 2, as a special edition on opto-electronic components and switching elements, and in the book "Charge Transfer Device" by Sequin and Tompsett, published by "Academic Press, Inc.", 1975. All described types of semiconductor image sensors can be used as embodiments of the invention.

The optical unit of the solid state television camera can be designed in an advantageous manner. By providing a filter carrier with corresponding color filters over or below the imaging optics, a color television camera can be very easily made. If a two-dimensional array of semiconductor image sensors is used, one respective color is advantageously associated to the individual linear arrays of semiconductor image sensors in a periodic sequence, so that the output lines of the respective linear arrays of the semiconductor image sensors as a whole serve to supply the video signals in the various primary colors Furthermore, the optical unit can contain a photochromic cover glass, or an electrochromic as well as an electrochemical transparent disk structure, to be able to control the light intensity directed on the semiconductor wafer. The control of the solid-state television camera in accordance with the invention is effected, as stated above, by means of an electronic control unit connected to the substrate contact parts. By applying corresponding voltages to the electrochromic transparent disk structure the respective incoming light intensity can be easily controlled.

By disconnecting or inserting semiconductor image sensors of the semiconductor wafer, it is furthermore possible to adjust the focal range, because with a decreasing matrix size of the semiconductor image sensor array the focal range may be increased.

The function of an iris diaphragm can be realized in that only the amount of semiconductor image sensors that are required for the light conditions in connection with an image recording is called up for signal production. For coarse control of the photosensitivity the above mentioned photochromic cover glass can be used.

By suitable clock pulse control of the individual semiconductor image sensors on the semiconductor wafer it is furthermore possible to implement electronic focusing in that the individual semiconductor image sensors, depending on their positions on the semiconductor wafer, are sensed in a staggered mode by correspondingly modifying the starting point in vertical and/or horizontal scanning processes.

If the semiconductor image sensor consists of only one linear array of semiconductor image sensors, for a predetermined photosensitivity the focal range in one direction is much greater than in the other.

If the scanning frequency and addressing in horizontal and/or vertical scanning of the semiconductor image sensors are varied, different image sizes can be obtained as a function thereof, which corresponds to a phantom zoom effect, the advantage being that this is also to be executed independently for both image coordinates.

The amount of corrections for the imaging optics used can be kept very low, even if only one-lens imaging optics are used, since if the system is used in color television operation each lens has to transmit one chromaticity only, and since the image distance is predetermined. If necessary, the image distance can be individually predetermined for each primary color in that e.g. in each case the distances between the respective imaging optics and the associated semiconductor image sensors are determined as a function of the primary color.

Geometrical distortion in the form of parallax errors caused by the imaging optics can be substantially corrected in that for the semiconductor image sensor matrix in first approximation a round circumference is provided. If the system aims at a practically distortion-free precision of the recorded images the individual semiconductor image sensors, for the compensation of the respective geometric distortions, would have to comprise photoelectronic circuit elements which are arranged alongside coordinates curved in accordance with the desired compensation of distortion.

The casing of the camera can be of such a design that any necessary converter optics can be added. These converter optics can also be pivotably mounted on a frame carrying the solid state television camera, or rotatably affixed thereto, respectively.

The objects of the present invention are to provide a solid state television camera with the following advantages:

all-solid-state television camera in the true sense of the word without movable parts practically maintenance-free operation with full electronic adjusting and control means use of semiconductor wafers manufactured at a much higher yield simplified assembly process only three units required, i.e. optical unit, electronic unit, and casing.

These and other objects, features, and advantages will be apparent from the following more particular description of the preferred embodiments.

BEST MODE FOR CARRYING OUT THE INVENTION

Figure 1:
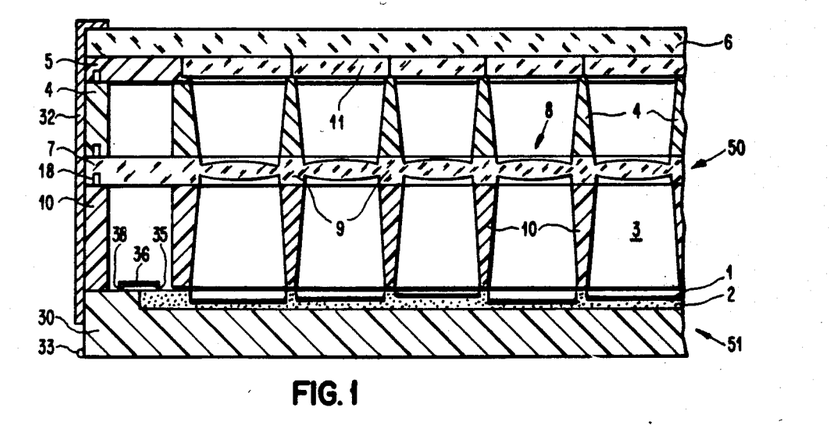
FIG. 1 shows parts of a cross-section of a first embodiment of the solid-state television camera in accordance with the invention.
Figure 6:
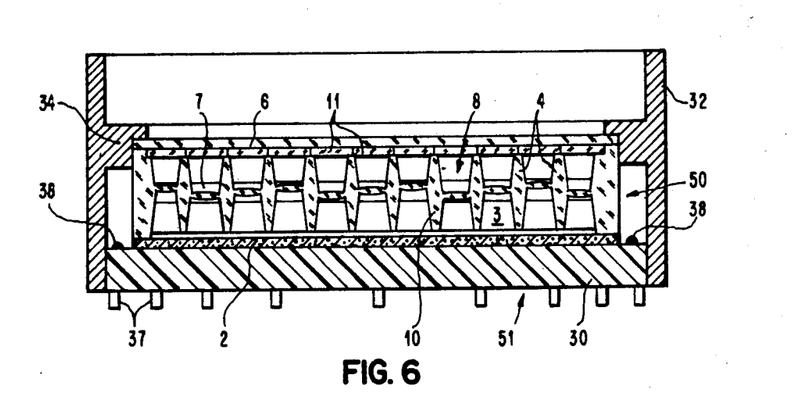
FIG. 6 shows a cross-section of a second embodiment of the solid-state television camera in accordance with the invention.

The solid-state television camera of FIG. 1 can contain either a linear array of semiconductor image sensors 1 in a semiconductor wafer 2 or a two-dimensional array of semiconductor image sensors 1 in semiconductor wafer 2. On an insulating substrate 30 providing electrical insulation as well as heat insulation for specific instances being involved here, FIG. 1 depicts a semiconductor wafer 2 into which semiconductor image sensors 1 are to be introduced either in linear or in two-dimensional array as a matrix. Semiconductor wafer 2 can either be inserted in an insulating substrate 30 (FIG. 1), or it can be placed onto substrate 30 (as shown in FIG. 6). Substrate 30 can consist of a multi-layer ceramic carrier to facilitate, given the conductor patterns contained therein, the connections to the substrate contact parts which can consist of edge contacts 33 (FIG. 1) or contact studs or contact pins 37 (FIG. 6). Substrate 30 can be provided, if necessary, with further conductive patterns for control units to be connected.

By means of modern VLSI-techniques, a relatively high number of semiconductor image sensors 1 can be provided on a semiconductor wafer, i.e. in the order of 100 (see also: Scientific American, pp. 67, 68, January 1982). In order to ensure the cross-over insulation of the individual conductive patterns which are required for coordinate addressing, several inter-insulated metallization planes containing the conductive patterns can be provided above the semiconductor surface. In order to ensure a free incidence of light onto the sensor surfaces of the image sensors, the conductive patterns in the individual metallization planes generally have to be applied between image sensors 1, but it is also possible to arrange transparent conductive patterns which can, e.g., consist of tin oxide, indium oxide, thallium oxide, cadmium oxide, etc. above the light collector surfaces themselves.

Another way of arranging conductive patterns independently of image sensor surfaces consists of providing electrical conductors in the semiconductor wafer in the form of heavily doped buried zones. All these conductors and conductive images serve to operate, control, and address semiconductor image sensors 1 on semiconductor wafer 2, with an additional conductive pattern having to be provided for the output of the video signals.

Figure 4:
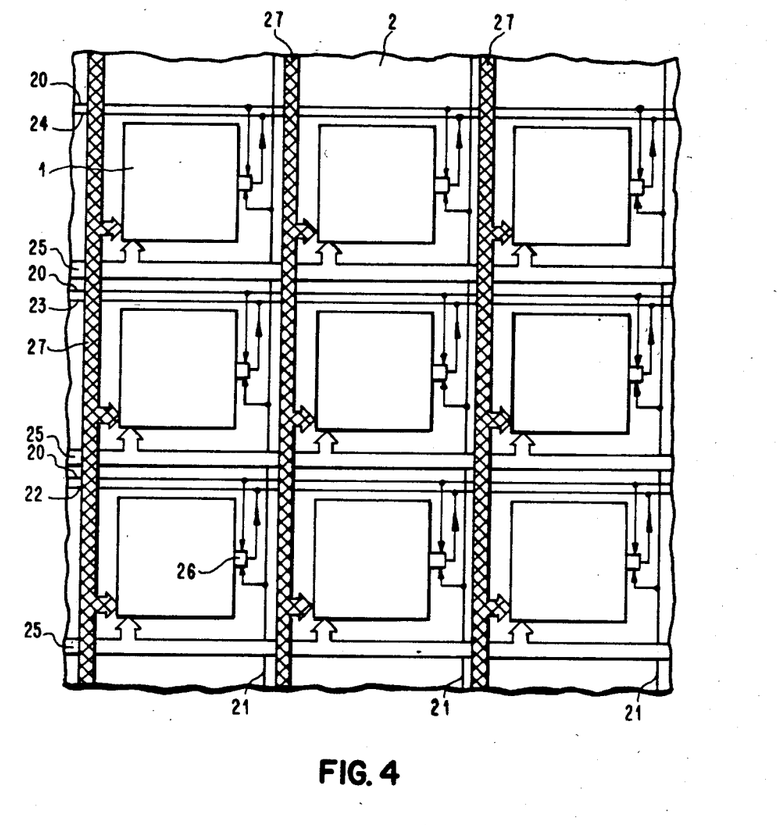
FIG. 4 shows a sector of a general circuit diagram of a two-dimensional arrangement of the semiconductor image sensors on the semiconductor wafer.

Semiconductor wafer 2 can be applied onto substrate 30 by means of known methods, as mentioned in the above mentioned book "Microelectronics Interconnection and Packaging" on pp. 173 to 206. The semiconductor image sensors consist of scanner matrixes formed of two-dimensional component arrays which have shift registers associated thereto as horizontal and vertical sensors, the video signals being produced in series via a sensor amplifier 26 (FIG. 4). Depending on the type of photosensitive components used in their respective matrices, the horizontal and vertical sensors consist either of one single horizontal and one single vertical shift register for the scanner matrix, as in photodiodes or phototransistors and in CID scanner matrices, or of shift registers associated with each scanner line or each scanner row, and possibly protected against incident light. These are then successively read out serially via output shift registers and a common output amplifier, as in CCD and bucket brigate devices. A clear precis hereof is given in the above mentioned book "Charge Transfer Devices" of the series "Advances in Electronics and Electron Physics, Supplement 8" by Sequin and Tompsett, published in Academic Press Inc., 1975, pp. 152 to 157.

The thus described electronic unit 51 is supplemented by the below described optical unit 50 both of which are housed in a sleeve 32 representing the television camera casing.

Whereas in accordance with FIG. 1 the respective connection between contact pads 35 on semiconductor wafer 2 and corresponding contact pads on substrate 30 is effected via cross-over connections 36, the connecting lines in the embodiment according to FIG. 6 are provided in such a manner that the contact pads on substrate 30 are connected to contact pads 35 on semiconductor wafer 2 via conductive V-grooves in the lateral edge of the semiconductor wafer. The type of connection used substantially depends on whether semiconductor wafer 2 is inserted into substrate 30 as depicted in FIG. 1, or whether it is placed onto substrate 30 as in FIG. 6.

Substrate contact parts 33 and 37 can be provided, if necessary, on one single substrate simultaneously, in the form of edge contacts 33 as well as in the form of contact studs or contact pins 37, so as to facilitate possible connections. The use of a multi-layer ceramic structure as a substrate 30 will then be of particular advantage. Optical unit 50 consists of a light funnel array 10 provided behind semiconductor wafer 2 and containing several light funnels 3 associated with the respective individual semiconductor image sensors 1. These light funnels widen in the direction of semiconductor image sensors 1, seen from the light incidence side. On funnel array 10, a lens array 7 is provided which as imaging optics 8 comprises between frames 9 a corresponding number of lenses which each have an associated light funnel 3. If television camera housing 32 is designed accordingly, lens array 7 can be fixed therewith and can consequently be kept in its position, but a positive connection can additionally be provided between funnel array 10 and lens array 7 which in the present case is depicted as a mortise connection 18.

For mutual light shading, either funnel array 3 itself or frames 9 can be opaque. The lens array can comprise lenses inserted therein, or it can form one single workpiece made by casting, compression molding, and/or grinding. The material used can be glass or synthetics. The above described entire optical unit 50 could even consist of only one single compressed or cast workpiece.

The above described units already comprise all prerequisites for a simple black and white television camera which, as pointed out above, can consist in its basic design of only one single linear array of semiconductor image sensors 1 in semiconductor wafer 2. However, such a basic solid-state television camera can be of specific advantage only if it is itself used as a device in an assembly where, in view of the inclusion there is no risk of the incidence of lateral scattered light onto lens array 7, i.e. where no specific sunshade element is required, and where furthermore the black and white image recording fully comes up to the respective purpose involved.

If the solid-state television camera is to be used as an independent device the installation of a sunshade means ensures that laterally incident scattered light cannot cause undesired recording interruptions. A suitable means to that end consists in placing a second funnel array 4 with transparent walls onto lens array 7, possibly in a positive connection, with the funnels of said funnel array diverging on the object side. A suitable cover over the incidence openings of the second funnel array 4 prevents dust from collecting on lens array 7.

In the realization of a television camera, however, the above cover can be replaced by color filters 11 provided either in a specific filter carrier 5, or directly inserted in a correspondingly shaped upper part of the second funnel array 4 (FIG. 6). If necessary, filter carrier 5 can be positively connected with light funnel array 4.

The optical and electronic units 50, 51 can be fixed in a variety of ways in sleeve 32, and can also be cast. Screw and pin connections are for instance, suitable. If a linear array of semiconductor image sensors 1 in a semiconductor wafer 2 as a television camera is used, color filters 11 consist of individual disks with primary colors periodically following each other so that image sensors 1 associated via light funnels 3 are each associated to a primary color, too. The output amplifiers of image sensors 1 of respectively the same primary color are each applied to a common output line which transmits the video signal of the respective primary color.

Figure 2:
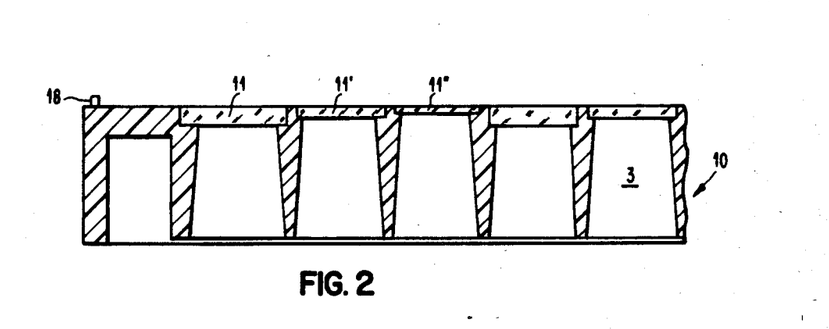
FIG. 2 shows part of a cross-section of a light funnel array with inserted color filters

Since according to the invention the solid-state television camera is to be as simply designed as possible, very uncomplicated imaging optics 8 are preferred, having of course corresponding lens defects. Even if the lenses of a lens array are designed aspherically to compensate for lens errors, there may still remain considerable chromatic defects if the system is used as a color television camera. There exist many ways of avoiding this kind of defect as much as possible, the least complicated being that depicted in FIG. 2. Here, the upper part, i.e. the part carrying lens array 7 of the lower funnel array 10 is given recesses of differing height to provide color filters 11, 11', 11" of thicknesses depending on the primary color for a planar surface directed toward lens array 7. FIG. 2 shows that funnel array 10 is designed in such a manner that the side walls cannot quite reach the semiconductor surface. The thus formed slots at the lower edge will only allow negligible mutual scattering exposure per adjacent image sensor 1, but it is made sure in this manner that the semiconductor surface is protected against damaging pressure effects. The different thicknesses of the color filters cause respective different image positions with respect to height, so that all images in the primary colors are on a common image plane which is represented by the planar semiconductor surface.

Another way to compensate the chromatic aberration of the image location is to use different spacings for the various primary colors between imaging optics 8 and the semiconductor image sensor surfaces. In this way, as shown in FIGS. 1 and 6, color filters 11 are provided on the object side of imaging optics 8. The respectively necessary relative spacing is achieved in that either, as shown in FIG. 1, the respective semiconductor surfaces of image sensors 1 associated to the primary colors are arranged in accordingly different height, or in that lenses 8 provided in lens array 7 are arranged therein at different levels, depending on the primary color (FIG. 6).

All these steps, however, correct only the respective chromatic aberration of the image location, but not the second type of chromatic aberration, i.e. that of image enlargement. Apart from the above described design and dimensioning of the image-side light paths, the dimensioning of the recording surfaces of the respective image sensors 1 has to be different, too, depending on the associated primary color. With a short image distance the recording surface is smaller than with a big image distance. To compensate consequent errors the sensor surfaces, with the amount of structure elements wherein being maintained, i.e. with the same amount, are designed differently, depending on their associated primary color. In view of the fact that it is made sure that there is always the same number of structure elements in the individual image sensors 1, the video signals associated with each respective pixel, and correlated to the various primary colors are, at the predetermined clock times upon readout, simultaneously transferred via the respective output lines 22, 23, and 24 (FIG. 4). With the degree of integration to be reached on a semiconductor wafer 2, this step to compensate the color aberration of image enlargement will not present any specific problems.

With color filters of different thicknesses (color filter 11 for the primary color red is thickest and color filter 11" for the primary color blue is thinnest), the distance between the lens and the semiconductor surface is smallest in connection with the use of different light path dimensions for respective red light paths. For blue light paths, the distance between the lens and the respective semiconductor surface is greatest.

As pointed out above, all components of optical unit 50 can be superimposed for the precise alignment with respect to each other via positive connections, as groove and feather connections, mortise connections etc., to be assembled in sleeve 32.

If up to now a linear array of semiconductor image sensors 1 on semiconductor wafer 2 has been assumed, the use of two-dimensional arrays of image sensors 1 on semiconductor wafer 2 requires corresponding modifications to be made in optical unit 50 as well as in electronic unit 51. The two-dimensional array (FIG. 4) practically consists of adjacent linear arrays of semiconductor image sensors 1, video output lines 22, 23, and 24 collecting and transferring the video color signals of all image sensors 1 associated with the various primary colors, onto the respective substrate contact parts 33 and/or 37. At any rate, longitudinal color filters 11 which cover one respective row (FIG. 4) associated with a primary color will be provided in color filter carrier 5, or inserted as color filters 11, 11', 11" immediately in the upper part of the respective light funnel array 4 or 10. If the color filter arrangement is provided in the upper light funnal array 4 it can be used at the same time as a cover to prevent the forming of dust on the respective lens array.

Quite another way of suppressing the chromatic defect, with suitable dimensioning and structuring of the light paths, consists in using color filters with a dispersion that is inverse relative to the lenses. Chromatic aberrations of the image location and of the image enlargement can be prevented at one and the same time without any further steps being required For various uses it can be of advantage to provide a coarse control of the light intensity directed on the semiconductor surface. This can be done in two ways, i.e. either to provide on the object side a cover for the solid-state television camera with a photochromic or phototropic plate, or to fix on the object side in optical unit 50 a disk structure comprising an electrochromic medium. The term electrochromic is also intended to comprise the term electrochemical since both processes are closely related; at any rate a dimming of the medium is induced under the influence of an applied field. Such arrangements for controlling the intensities of the incident light are advisably provided over color filters, or in the upper part of upper light funnel array 4 so as to be available also as a dust cover. Whereas if a phototropic or photochromic medium is used the light fades automatically as a factor of the intensity of the incident light, the light fading in the electrochromic medium depends on the electric voltage or field intensity applied thereto. For applying a control and drive voltage to the thus used electrochromic medium, supply lines can be employed extending either at or in sleeve 32, or via corresponding walls of the funnel array or funnel arrays up to the respective substrate contact parts 33 or 37. By means of the control unit connected thereto the electric field to be applied, and thus also the light intensity directed on the semiconductor surface regions, can be controlled or driven in a known manner.

FIG. 1 shows how optical unit 50 and electronic unit 51 are arranged and also fixed in sleeve 32. Photochromic or electrochromic structure 6 is directly placed against an internal flange of sleeve 32 which then successively receives filter carrier 5, upper light funnel array 4, lens array 7, lower light funnel array 10, and substrate 30 which can easily be fixed therein by screws, pins, etc.

The positive connection depicted in FIG. 1 by means of mortise connection 18 between lower funnel array 10, lens array 7, upper funnel array 4, and filter carrier 5 is not necessary if a precise succession of the above mentioned components is ensured when they are fitted into sleeve 32.

It is obvious, and it has also been mentioned above that semiconductor image sensors 1, depending on their associated primary color, can be on different levels within semiconductor wafer 2. If it is taken into consideration that the difference of levels of these semiconductor surfaces is in the order of 1% with reference to the image distance, this will not cause any specific problems in semiconductor production, either.

Up to now, a solid-state television camera has been described whose imaging optics 8 are each represented by only one lens. For simple functions this may fully suffice since, as pointed out above, each lens has to transmit only one color range, and since geometrical distortions can generally be accepted. Additionally, the lenses can be aspherical so that images of excellent quality are obtained. If top quality is wanted, however, the imaging optics have to comprise several lenses for a maximum correction of the lens or image errors. For that purpose, several lens arrays can be stacked one over the other (FIG. 3) by means of corresponding positive connections.

Figure 3:
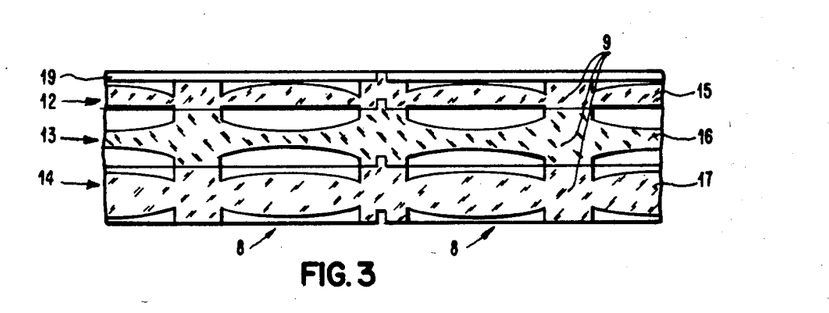
FIG. 3 shows part of a cross-section of lens arrays arranged one over the other for providing multi-lens imaging optics.

FIG. 3 shows how such an imaging optics field can be realized, e.g. with Cooke objectives. Upper lens array 12 substantially contains plano-convex lenses 15, center lens array 13 comprises concave-concave lenses 16, and lower lens array 14 comprises convex-convex lenses 17 arranged in the respective lens arrays between frames 9. Again, either individual lenses can be inserted in the lens arrays, or they can consist together with the respective lens array 12, 13, 14 of one respective single workpiece which, as specified above, is correspondingly processed by casting, compression, and/or grinding.

For the respective positive connections one representative groove and feather connection 19 is shown ensuring the maintenance of a precise mutual position. Such an imaging optics arrangement for the realization of a corresponding solid-state television camera is provided between upper funnel array 4 and lower funnel array 10, again over groove and feather connection 19. A more comprehensive chromatic defect correction that might be necessary can be implemented by means of the steps specified above. Upper funnel array 4, together with upper lens array 12 and lower funnel array 10 with lower lens array 14 can form one respective workpiece made by casting, compression and/or grinding. Again, the lenses can be inserted separately, or as above form one workpiece with the respective lens array.

Since the addressing as well as the operation of two-dimensional semiconductor image sensors 1 is well known, no further reference thereto will be made here, nor to the production of semiconductor wafers 2 with incorporated semiconductor image sensors 1. For reading out the pixel data from the image sensors arranged in matrix fashion in image sensors 1, horizontal shift registers are generally used which, corresponding to clock signals in the form of a clock pulse, transmit the row information to output amplifier 26. Also used are vertical shift registers which successively effect row scanning. In the present case, this is implemented via working lines for transmitting the necessary clock pulses in busses 25 and 27 (FIG. 4). Additionally, these busses 25 and 27 also contain clock pulse control lines for the coordinate-wise addressing of a respective semiconductor image sensor 1 for being able to release selectively horizontal and/or vertical scanning of each discretionary image sensor 1 in semiconductor wafer 2 with the desired row and/or column. Such a release is implemented by means of control signals supplied by a control unit connected to the respective substrate contact parts 33 or 37, since busses 25 and 27 are connected via corresponding contact pads 35 on semiconductor wafer 2 to the respective substrate contact parts 33 and 37.

Due to this manner of control, the solid-state television camera as disclosed herein can be used to cause a "phantom" zoom effect, in that on all semiconductor image sensors the horizontal and/or vertical scanning is executed with row and/or column staggering rather than with the respective first column and/or row. In such a process, a correspondingly reduced amount of structure elements is available for each image sensor surface, but for the image quality as such the minor disadvantage thereof is of less importance provided a correspondingly high amount of structure elements is installed in the individual semiconductor image sensors 1.

As the solid-state television camera according to the invention has been structured using a fixed focus system, there may be focussing errors which are inacceptable for very high demands. It is a well known fact that objects with a distance to the camera that is no longer compatible with the infinity setting cause a corresponding lateral aberration of the focal points respectively projected through imaging optics 8 on the semiconductor surface, i.e. for such cases the image surface is shifted, so to speak, from the central position of the respective semiconductor image sensor 1. This fact can be taken into consideration if only that surface region of the respective image sensor 1 is horizontally and vertically scanned which in a focal point shifting is actually to be illuminated by imaging optics 8, so that in those cases, too, and with the same clock times there exist from all image sensors 1 similar video signals, i.e., the same pixels.

The above mentioned focal point aberration continuously increases if the object distance is no longer compatible with the infinity setting and if, starting from the central position of image sensors 1 on semiconductor wafer 2, image sensors 1 are shifted more and more towards the wafer's rim, so that a corresponding loss of image sensor surface of each image sensor 1, using staggered horizontal and vertical scanning is considered acceptable. As pointed out above, this is generally tolerable owing to the possible degree of integration.

Furthermore, the solid-state television camera according to the invention, with a corresponding design of electronic unit 51 and especially of semiconductor wafer 2, permits the easy implementation of an iris diaphragm. It has merely to be made sure that of the image sensors 1 arranged on semiconductor wafer 2, groups of image sensors 1 can be switched on and off for the supply of video output signals via video output lines 22, 23, 24. For that purpose, the respective output amplifiers 26 of the individual image sensors 1 are designed as switching circuits. The survey according to FIG. 4 gives only a specific region on the semiconductor surface, but merely for graphical reasons. Actually, the surface region for the output amplifier is integrated in image sensor 1 in a known manner.

Output amplifiers 26 designed as switching circuits permit a coordinate-wise addressing of each output amplifier 26 via output control lines 20, 21. Only if both switching variables provided for that purpose are applied at the control inputs of these output amplifiers 26 will respective output signals be transmitted to video output lines 23, 24, and 25 from the respective image sensors 1. In this manner, via the control unit connected to substrate contact parts 33 or 37, the respective portion contributed by image sensors 1 to the providing of the video signals can be easily controlled and thus executes the function of an iris diaphragm.

Figure 5:
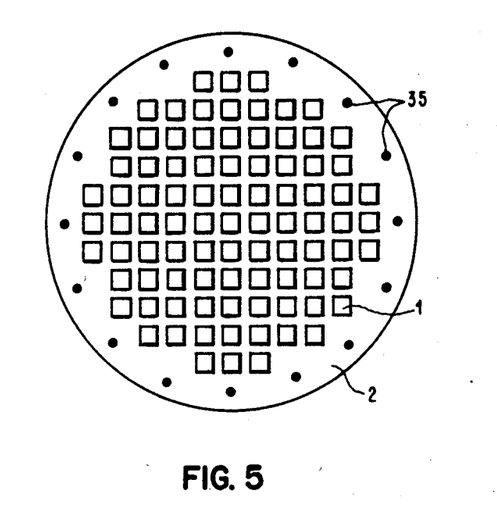
FIG. 5 shows a schematic plan view of a semiconductor wafer with semiconductor image sensors indicated therein.

To exclude parallax errors, image sensors 1 are inserted into a semiconductor wafer 2 (FIG. 5), with optimum utilization of an available circular area. A corresponding amount of space will have to be considered for contact pads 35 in the marginal zone of circular semiconductor wafer 2, and between the individual image sensors 1, for control operation and clock lines. The above mentioned book about VLSI technique gives a sufficient amount of examples for the optimum utilization of semiconductor surfaces with respect to monolithically integrated semiconductor circuits to be provided therein, so that no further reference thereto has to be made here.

If all these lens error compensating steps are still insufficient for maximum demands on the camera, geometrical distortion errors can be eliminated by a corresponding lay-out of the individual image sensors 1 on the semiconductor wafer with respect to the structure element array therein. Geometrical lens errors exist in the form of so-called barrel and pincushion distortions. Therefore, in each image sensor 1 the structure elements are introduced along coordinates that are curved according to the desired compensation, i.e. for barrel distortions along coordinates causing a cushion-like lay-out of the respective image sensors, and vice versa.

It is pointed out here that the drawings are neither true to scale, nor permit a faithful reproduction with respect to the components and structure elements shown. To give an example: the number of contact pads 35 in FIG. 5, and of contact pins 37 in FIG. 6 do not correspond to reality but have merely been selected for better demonstration.

FIG. 6 shows a simple embodiment of the all-solid-state television camera in accordance with the invention which incorporates all conditions for satisfactory results. As specified above, electronic unit 51 consists of a multilayer ceramic carrier representing substrate 30, with contact pins 37 inserted therein. Substrate 30 carries a semiconductor wafer 2 which is applied thereon and carries optical unit 50. As stated above, contact pads 35 of semiconductor wafer 2 are connected via conductive V-grooves in the rim of semiconductor wafer 2 with corresponding contact pads 38 and substrate 30. Optical unit 50 comprises a workpiece which consists of upper light funnel array 4, lens array 7 with lenses inserted therein and serving as imaging optics 8, and lower light funnel array 10. Again as stated above, this workpiece can also be provided either by means of casting, compression, and/or grinding in a respective shape, or it can be made wherein the lenses are individually placed into lens array 7. Here, too, the lenses are of an aspherical shape.

It is of course also possible that alternatively, in particular if several lens arrays are used, one single workpiece is made. The walls of the funnel arrays and/or frame 9 are opaque, so that there exists an efficient light screen against adjacent light funnels. If separate lens arrays are used it will be sufficient if frame 9 between the lenses is opaque. In any case, however funnel array and lens array 7 can consist of the same, or of different material, e.g. glass or synthetics.

Upper funnel array 4 in the arrangement according to FIG. 6 is provided to receive color filters 11 extending longitudinally and perpendicularly to the paper plane, with periodically changing primary colors. Over color filter 11 there is a plate structure with an electrochromic medium which is connected to conductors (not shown) which extend over the outer wall of funnel arrays 4 and 10 and which, via connections over the rim of the semiconductor wafer, are also connected to respective substrate contact parts 37. In this manner, an electronic control of the light intensity on semiconductor wafer 2 can be effected by means of connected control units.

Sleeve 32 comprises a staggered internal flange 34 holding optical component 50 of the television camera. Substrate 30 is firmly connected to sleeve 32 in a manner known per se in that optical unit 50 is pushed against the respective recess in internal flange 34. Lower funnel array 10 does not contact the semiconductor surface within the region of image sensor 1.

The control unit provided for operating the solid-state television camera can be actuacted either via a corresponding cable connection to substrate contact parts 37, or via a control unit placed directly onto electronic unit 51, said control unit also containing the necessary current supply units. For developing the solid-state color television camera according to the invention into a video camera, this control unit with the current supply units can be part of a video system equipped with corresponding storage units for video storage. For that purpose, there exist a great variety of ways which will not be discussed in detail here.

It can furthermore be of advantage for some uses to provide converter optics on the object side, over optical unit 50, i.e, a wide angle objective or a long focal length objective. It can be designed in such a manner that it is placed directly onto sleeve 32 by screw or bayonet means or, if the television camera is incorporated into a large assembly, it can be pivotably arranged opposite thereto. Various ways are possible, depending on the use involved.

While the invention has been described with respect to preferred embodiments thereof, it will be appreciated by those of skill in the art that variations thereof can be provided, without departing from the spirit and scope of the invention.

Having thus described my invention, what I claim as new and desire to secure by Letters Patent is:

1. A solid-state television camera with semiconductor image sensors
    which are to be exposed via imaging optics, and which consists of a monolithically integrated microcircuit comprising horizontal and vertical scanners as well as output amplifiers and which is substrate-tied and connected via contact pads of said microcircuit to substrate contact parts, clock pulses being applicable to said sensors for horizontal as well as vertical scanning via further contact pads connected to corresponding ones of said substrate contact parts
    characterized in that at least one linear array of said semiconductor image sensors is provided in a single semiconductor wafer to form an electronic unit,
    wherein the control inputs of the output amplifiers are selectively addressable via output control lines connected to respective ones of said substrate contact parts and that said horizontal and vertical scanners are selectively addressable via clock pulse control lines connected to respective ones of said substrate contact parts;
    an optical unit for the purpose of mutual light shading of adjacent beam paths and including all imaging optics, each imaging optics having an associated light funnel extending at least between said optics and an associated semiconductor image sensor wherein said optical unit and said electronic unit are mounted in a housing,
    characterized in that at least one lens array is provided which carries as a fixed focus raster optics said imaging optics with an image distance that is negligible compared with the object distance, the lenses of said array being separated from each other by frame walls and being also supported thereby, and wherein said array is mounted by means of a light funnel array placed against the frame walls and at least partly forming said light funnels at a distance from said semiconductor wafer that is predetermined by the image spacing.

2. The solid-state television camera of claim 1, further including color filters in said optical unit for periodically successive correlation of the primary colors to individual said semiconductor image sensors, the light paths in said optical unit for the respective primary colots being dimensioned with regard to image position to suppress chromatic defects of said optical unit, the video output lines of the output amplifiers being assembled in accordance with said primary colors at the respective contact parts.

3. The solid-state television camera of claim 2, characterized in that said semiconductor image sensors are arranged in a two-dimensional array, the linear arrays of the semiconductor image sensors being associated, in periodical succession, with respective ones of the primary colors when the respective color filters extending along the respective linear array are inserted either in the upper part of a light funnel array itself, or in a specific color filter carrier placed into a light funnel array.

4. The solid-state television camera of claim 3, characterized in that for reducing the parallax errors of the television camera, said two-dimensional array of semiconductor image sensors in said semiconductor wafer has in a first approximation a circular circumference.

5. The solid-state television camera of claim 1, characterized in that said lens array is equipped with aspherical lenses and with connecting elements for the positive connection with further construction elements of said optical unit, said lens array being a single workpiece.

6. The solid-state television camera of claim 5, characterized by several superimposed lens arrays for providing multi-lens imaging optics, each array consisting of aspherical lenses.

7. The solid-state television camera of claim 5, characterized in that the same material is used for said lens array and said adjacent light funnel array, both of which are shaped from one single workpiece.

8. The solid-state television camera of claim 5, characterized in that said frame walls of said lens arrays and said light funnel arrays are comprised of a light-absorbing material.

9. The solid-state television camera of claim 1, characterized in that said lens array includes aspherical lenses and, together with the adjacent said light funnel arrays, is part of a single workpiece as a structural element of said optical unit.

10. The solid-state television camera of claim 1, characterized in that said housing extends over said optical unit and is provided with means to receive converter optics.

11. A solid-state television camera with semiconductor image sensors which are to be exposed via imaging optics, and which consists of a monolithically integrated microcircuit comprising horizontal and vertical scanners as well as output amplifiers and which is substrate-tied and connected via contact pads of said microcircuit to substrate contact parts, clock pulses being applicable to said sensors for horizontal as well as vertical scanning via further contact pads connected to corresponding ones of said substrate contact parts,
characterized in that at least one linear array of said semiconductor image sensors is provided in a single semiconductor wafer to form an electronic unit,
wherein the control inputs of the output amplifiers are selectively addressable via output control lines connected to respective ones of said substrate contact parts and that said horizontal and vertical scanners are selectively addressable via clock pulse control lines connected to respective ones of said substrate contact parts,
an optical unit for the purpose of mutual light shading of adjacent beam paths and including all imaging optics, each imaging optics having an associated light funnel extending at least between said optics and an associated semiconductor image sensor wherein said optical unit and said electronic unit are mounted in a housing,
characterized by a second light funnel array extending from said imaging optics on the object side, and being externally covered, and having a sunshade function, and being composed of light funnels.

12. The solid-state television camera of claim 11, characterized in that the cover of said second light funnel array consists of a color filter structure.

13. The solid-state television camera of claim 11, characterized in that the cover of said second light funnel array consists of an electrochromic structure.

14. The solid-state television camera of claim 11, characterized in that the cover of said second light funnel array consists of a photochromic structure.

15. The solid-state television camera of claim 11, characterized in that the cover of said second light funnel array consists of a phototropic structure.

16. A solid-state television camera with semiconductor image sensors which are to be exposed via imaging optics, and which consists of a monolithically integrated microcircuit comprising horizontal and vertical scanners as well as output amplifiers and which is substrate-tied and connected via contact pads of said microcircuit to substrate contact parts, clock pulses being applicable to said sensors for horizontal as well as vertical scanning via further contact pads connected to corresponding ones of said substrate contact parts,
characterized in that at least one linear array of said semiconductor image sensors is provided in a single semiconductor wafer to form an electronic unit,
wherein the control inputs of the output amplifiers are selectively addressable vai output control lines connected to respective ones of said substrate contact parts and that said horizontal and vertical scanners are selectively addressable via clock pulse control lines connected to respective ones of said substrate contact parts,
an optical unit for the purpose of mutual light shading of adjacent beam paths and including all imaging optics, each imaging optics having an associated light funnel extending at least between said optics and an associated semiconductor image sensor wherein said optical unit and said electronic unit are mounted in a housing,
characterized in that for compensating geometrical lens defects, such as barrel or pincushion distortions, the individual structure elements of themonolithically integrated microcircuits representing the respective semiconductor image sensors are incorporated in the semiconductor wafer along coordinates curved in accordance with the desired distortion error compensation.

17. A solid-state television camera with semiconductor image sensors which are to be exposed via imaging optics, and which consists of a monolithically integrated microcircuit comprising horizontal and vertical scanners as well as output amplifiers and which is substrate-tied and connected via contact pads of said microcircuit to substrate contact parts, clock pulses being applicable to said sensors for horizontal as well as vertical scanning via further contact pads connected to corresponding ones of said substrate contact parts, characterized in that at least one linear array of said semiconductor image sensors is provided in a single semiconductor wafer to form an electronic unit, wherein the control inputs of the output amplifiers are selectively addressable via output control lines connected to respective ones of said substrate contact parts and that said horizontal and vertical scanners are selectively addressable via clock pulse control lines connected to respective ones of said substrate contact parts, an optical unit for the purpose of mutual light shading of adjacent beam paths and including all imaging optics, each imaging optics having an associated light funnel extending at least between said optics and an associated semiconductor image sensor wherein said optical unit and said electronic unit are mounted in a housing, characterized by a wiring arrangement between the control inputs to said output amplifiers and said at least one linear array of semiconductor image sensors, said wiring arrangement being used to implement the function of an iris diaphragm, wherein respective ones of first control inputs to said output amplifiers are provided in said at least one linear array of semiconductor image sensors at a first output control line, and wherein second control inputs of said output amplifiers of said at least one linear array of semiconductor image sensors are connected to respective ones of second output control lines, such that by selectively switching off individual output amplifiers or output amplifier groups, said iris diaphragm function can be realized.

18. A solid-state television camera with semiconductor image sensors which are to be exposed via imaging optics, and which consists of a monolithically integrated microcircuit comprising horizontal and vertical scanners as well as output amplifiers and which is substrate-tied and connected via contact pads of said microcircuit to substrate contact parts, clock pulses being applicable to said sensors for horizontal as well as vertical scanning via further contact pads connected to corresponding ones of said substrate contact parts, characterized in that at least one linear array of said semiconductor image sensors is provided in a single semiconductor wafer to form an electronic unit, wherein the control inputs of the output amplifiers are selectively addressable via output control lines connected to respective ones of said substrate contact parts and that said horizontal and vertical scanners are selectively addressable via clock pulse control lines connected to respective ones of said substrate contact parts, an optical unit for the purpose of mutual light shading of adjacent beam paths and including all imaging optics, each imaging optics having an associated light funnel extending at least between said optics and an associated semiconductor image sensor wherein said optical unit and said electronic unit are mounted in a housing, characterized by coordinate-wise addressing via said clock pulse control lines connected to said semiconductor image sensors in busses associated with the coordinates of a two-dimensional arrangement of the semiconductor image sensors, a respective selectively staggerable horizontal and/or vertical scanning start in the thus addressed semiconductor image sensor, or in semiconductor image sensors addressed thereby, can be realized for implementing a focussing and/or "phantom" zoom function.

* * * * *